United States Patent [19]

Foss et al.

[11] Patent Number: 4,654,622

[45] Date of Patent: Mar. 31, 1987

[54] MONOLITHIC INTEGRATED DUAL MODE IR/MM-WAVE FOCAL PLANE SENSOR

[75] Inventors: Norman A. Foss, North Oaks; Paul W. Kruse, Jr., Edina; R. Andrew Wood, Bloomington, all of Minn.

[73] Assignee: Honeywell Inc., Minneapolis, Minn.

[21] Appl. No.: 781,557

[22] Filed: Sep. 30, 1985

[51] Int. Cl.⁴ ............................................. H01C 7/00
[52] U.S. Cl. ................................. 338/14; 343/700 MS
[58] Field of Search ............... 338/14, 22 R, 22 SD, 338/23, 24, 25; 73/432 AD; 357/51, 60; 343/700 MS, 720, 721; 250/250, 334

[56] References Cited

U.S. PATENT DOCUMENTS 3,801,949  4/1974  Larrabee ........................ 338/22 R
4,472,239  9/1984  Johnson et al. .................. 156/147

OTHER PUBLICATIONS

David B. Rutledge et al, "Imaging Antenna Arrays", IEEE Transactions on Antennas & Propagation, vol. AP-30, No. 4, Jul. 1982, pp. 535-540.
David Rutledge, "Integrated Circuits for Millimeter Waves", Nov. '84, Cal. Inst. Technology-Engineering & Science, pp. 19-22.

*Primary Examiner*—E. A. Goldberg
*Assistant Examiner*—M. M. Lateef
*Attorney, Agent, or Firm*—Omund R. Dahle

[57] ABSTRACT

A monolithic integrated focal plane sensor array having elements sensitive to IR radiation and elements sensitive to mm-wave radiation. The sensor elements of the array sensitive to mm-wave have microantennas coupled to the sensors.

8 Claims, 11 Drawing Figures

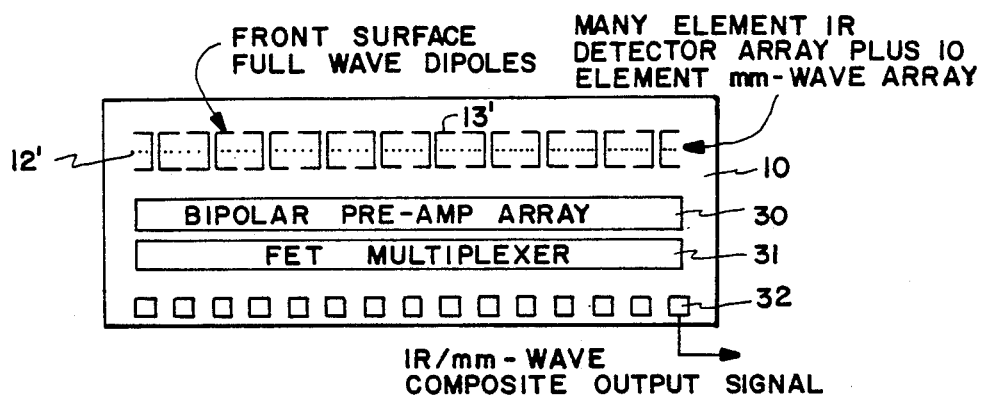
Fig. 4
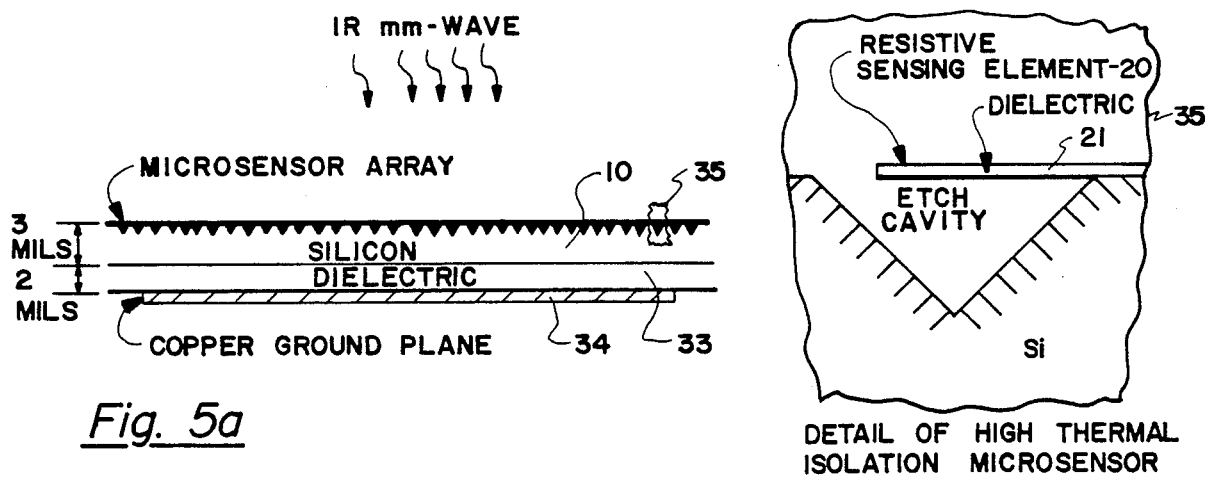
Fig. 5a
Fig. 5b
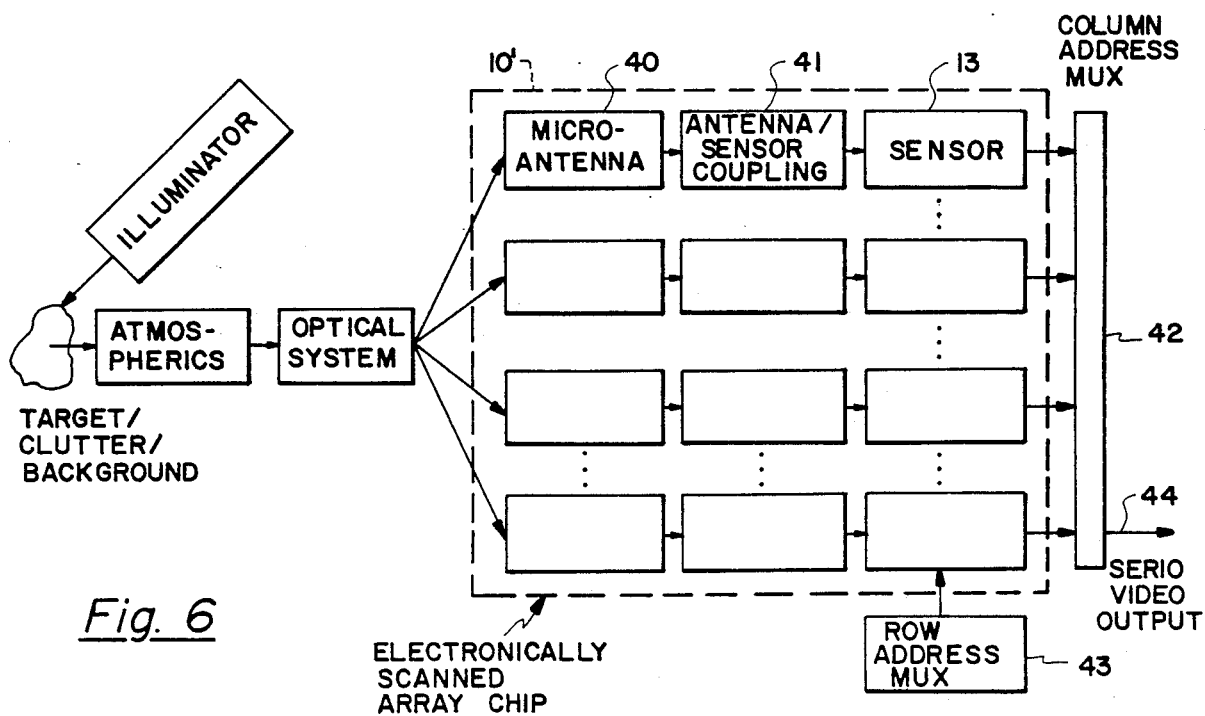
Fig. 6

4,654,622

MONOLITHIC INTEGRATED DUAL MODE IR/MM-WAVE FOCAL PLANE SENSOR

BACKGROUND AND SUMMARY OF THE INVENTION

A monolithic integrated focal plane sensitive to both mm-waves (typically 94 GHz) and (typically 3-5 and 8-12 micron) IR radiation is constructed on a silicon wafer by selective anisotropic etching to fabricate microbolometer radiation sensors in a linear or two-dimensional array. Sensors intended for IR detection are coated with an IR absorbing material. Those intended for mm-wave sensing are connected to metal film antennas deposited on the surface of the silicon wafer. In this structure there is combined known silicon IC processing techniques with a rugged high-g-load-tolerant structure that permits the thermal condution losses to approach the radiative losses of the element. Of particular importance is the combining and interspersing of millimeter wave sensors with high performance infrared sensors and electronics on the same silicon chip, and fabricating in the same processing steps.

The fabrication of novel three-dimensional microelectronic devices in a semiconductor crystal, typically silicon has been accomplished by fabricating the device through many techniques including isotropic and anisotropic etching. These techniques utilize the cystalline structure of a single crystal semiconductor. An example is the Johnson et al U.S. Pat. No. 4,472,239, "Method of Making Semiconductor Device", assigned to the same assignee as the present invention. The referenced patent shows that the technique is known to manufacture micromechanical devices by etching into single crystal silicon. The citation of this patent is provided merely as background and is not deemed as prior art to the specific invention claimed in this application.

In the prior art, such as U.S. Pat. No. 3,801,949, there has been taught an infrared sensitive solid-state imaging device which is small in size and which has a two-dimensional array of IR detector elements in an integrated microcircuit. The detector array is fabricated on a single crystal silicon substrate coated with a thin layer of electrical insulating material, such as silicon dioxide or silicon nitride. Etched openings are made in the silicon beneath the insulating layer wherever a sensing element is desired for the purpose of thermally isolating the sensing elements from their surroundings. In the present invention an integrated dual-mode IR/millimeter-wave sensor array is taught. The section of the magnetic spectrum including millimeter waves and 3-5 or 8-12 micron infrared radiation is shown in FIG. 1. The mm-waves of about 94 GHz and the 3-12 micron IR are several orders of magnitude apart in frequency and devices for sensing or detecting these two categories differ substantially. It is desired to fabricate a monolithic integrated two-dimensional focal plane array which has array elements sensitive to 3-5 and/or 8-12 micron IR and elements sensitive to mm-waves. The individual integrated sensors are about 0.1 mm in size and do not effectively couple the energy from the mm-waves which are of a greater wavelength. It has been discovered that when the integrated sensor elements intended for mm-wave detection are provided with antennas (such as full wave dipoles or bow-tie type) a successful mm-wave energy coupling apparatus is achieved.

BRIEF DESCRIPTION OF THE DRAWINGS

FIG. 4 shows the front surface detail of full-wave dipole antenna integrated IR/mm-wave array;

FIGS. 5a and 5b show detail of high thermal isolation microsensor;

FIG. 6 shows the overall scanned array functional diagram;

DESCRIPTION

Figure 1:
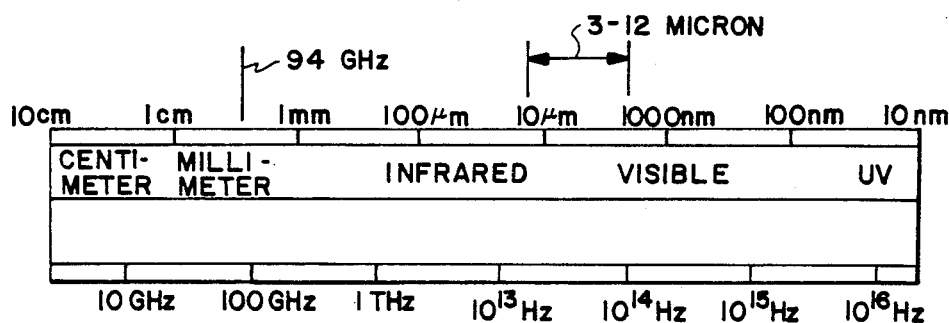
FIG. 1 shows a pertinent section of the electromagnetic spectrum.
Figure 2A:
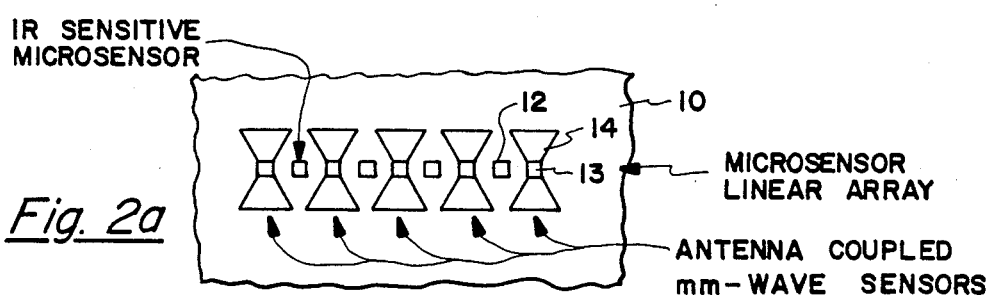
FIG. 2a is one embodiment of a microsensor linear array.
Figure 2B:
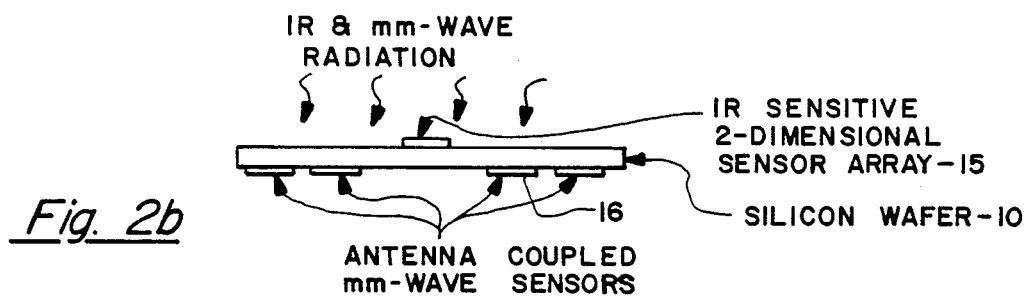
FIG. 2b discloses in two-dimensional geometry one embodiment of an integrated dual-mode IR sensors and mm-wave sensors.

Referring now to FIG. 2a there is shown a linear geometry version of a monolithic integrated dual mode IR/mm-wave microsensor linear array. Two-dimensional arrays mayb be obtained by constructing several adjacent linear arrays. A focal plane sensitive to both IR radiation (3-5 and/or 8-12 micron) and mm-waves is constructed on a semiconductor substrate wafer 10, such as monocrystalline silicon. The microsensors 12 intended for IR sensing are coated with an IR absorbing material such as a thin metal film. The microsensors 13 intended for mm-wave sensing are connected to metal film antennas 14 deposited on the surface of the silicon wafer. A two-dimensional geometry version is shown in FIG. 2b in which IR sensitive microsensor arrays 15 are formed on one surface of the silicon wafer 10 and antennas 16 are formed on the other surface of the wafer. Thsi embodiment will be described later.

Figure 3:
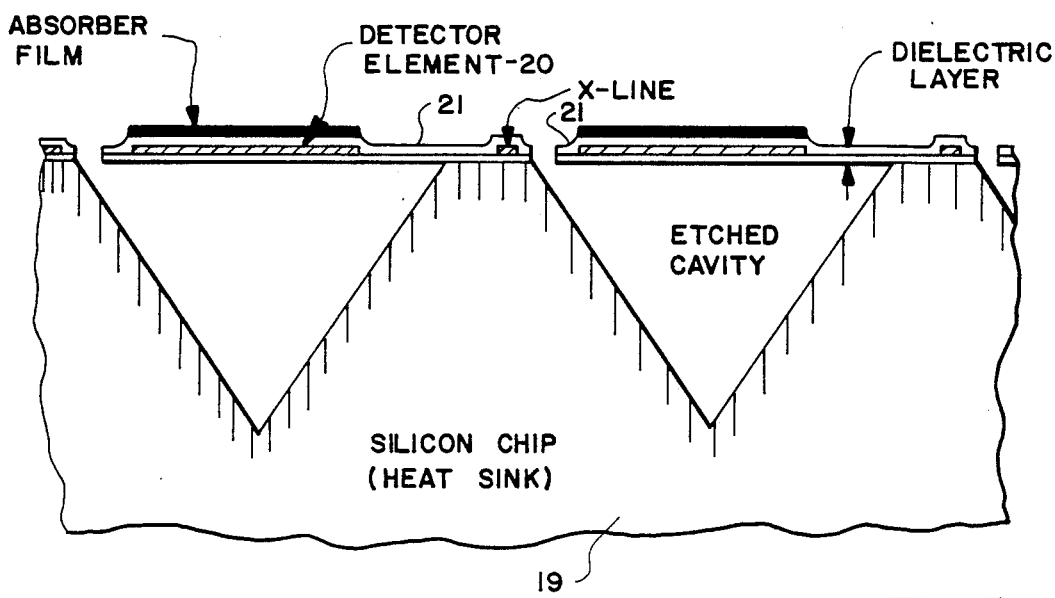
FIG. 3 shows a cross section of a microsensor structure.
Figure 7:
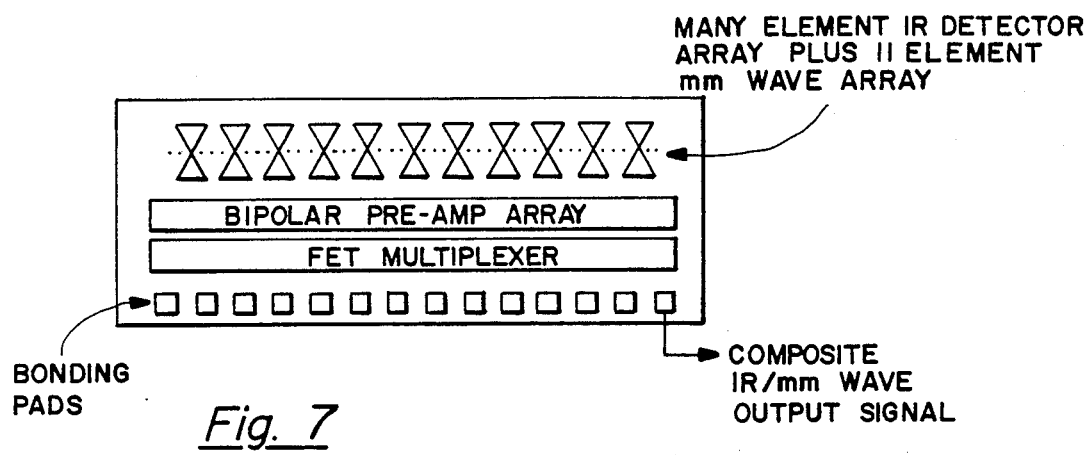
FIGS. 7 and 8 show the dual mode sensor design using bow-tie microantenna design.

In FIG. 3 there is shown a cross section of a microsensor structure showing the thermal isolation configuration as taught in U.S. Pat. No. 4,472,239, above referenced. The microsensor imaging array is on a silicon chip 19, based upon anisotropic silicon etching in which a small mass, thin film radiation detector 20 is fabricated into a thermally isolated dielectric cantilever structure 21 on the surface of the silicon chip. The small mass and thermal isolation provide arrays with excellent detector sensitivity and response time. The millimeter-wave array uses planar dipole or bow-tie type antennas to couple the mm-wave radiation to the thermally integrating microsensors.

In FIG. 4 there is shown a detail of the front surface of a full-wave dipole antenna type integrated infrared/-millimeter wave sensor electronically scanned linear array. Interspersed with the multielement (ex.=300) IR detector elements 12' are a plurality (ex.=10) of antenna coupled mm-wave elements 13'. Also shown in block form is a bipolar pre-amp array 30 and an FET multiplexer 31. An IR/mm-wave output signal is detected at 32. A partial cross section of FIG. 4 cut through the detector array is shown in FIG. 5a. The silicon wafer 10 also includes a dielectric layer 33 and a copper ground plane 34. A detail of one of the high thermal isolation microsensors 35 is shown in the balloon of FIG. 5b in which a resistor sensor 20 carrying dielectric cantilever 21 is thermally isolated by the etch cavity in the silicon.

A structure which is required to couple efficiently to a mm-wave radiation field must necessarily have dimensions of the order of about the wavelength, e.g. 3 millimeters at 94 GHz). In the case of an uncooled sensor, a sensitive area this large would lead to degraded responsivity or response speed due to the increased thermal mass of the sensor. We therefore require dimension of a few mils, and must therefore couple the sensor to the radiation field via an antenna structure with dimensions of the order of the wavelength. Since microsensor arrays can be conveniently fabricated on silicon substrates by photolithographic processes, we desire the antenna and any coupling waveguides to be planar in design.

The mm-wave array portion, such as shown in FIGS. 2a and 4, is further shown in FIG. 6 and consists of a silicon substrate 10', upon which we use photolithography to fabricate an array of planar microantennas 40, coupling waveguides 41 and microsensors 13, with electrical leadouts to an electronic readout circuit as shown in FIG. 6. MM-wave radiation is collected by the microantennas 40, and coupled 41 to the dissipative load of the microsensors 13, whose temperatures will rise causing the resistance to change. A low-noise electronic circuit including a column address mux.42 and a row address mux.43 monitors the resistances of the microsensor elements and provides electrical signals 44 to output circuitry dependent on the application such as target detection and recognition.

The microsensor consists of a low-mass sensor element 20 which is almost completely thermally isolated from its supporting structure as shown earlier in FIG. 3. A resistance element is fabricated on the sensor using a material whose resistance changes with temperature. Any electrical power dissipated in this sensor resistance (e.g. by direct infrared radiation on the sensor or by mm-wave radiation coupled in from an antenna) heats the sensor element 20 by an amount inversely proportional to the sensor thermal mass and thermal conductance to the supporting structure. The sensitivity of the microsensor requires a low thermal mass sensor and good thermal isolation. The dissipated heat will flow to the supporting structure with a time constant given by the sensor thermal capacity times the thermal resistance to the surroundings. This response time can be arranged to be milliseconds without sacrificing sensitivity; faster response times can be achieved by trading off sensitivity. The electrical output signals are obtained by the use of a readout circuit which is sensitive to resistance changes in the microsensor resistance.

The ultimate signal to noise ratio of such a microsensor is achieved by the use of a very small sensor thermal mass, and very high thermal isolation from the supporting structure. The minimum noise level possible is due to Johnson noise in the sensor load resistance, preamplifier noise and to fluctuations in the radiative and conductive power interchanged between the sensor and its surroundings. In the case of mm-wave radiation coupled electrically into a microsensor from a microantenna, the sensor may be coated with a highly reflective material so that radiation interchange noise can be reduced to a low level. In this case the noise limits would be due to (a) Johnson noise, (b) amplifier noise and (c) thermal conduction noise.

Of particular importance is the very low conduction noise which is achieved by the excellent thermal isolation and low mass of the proposed structure. Using typical parameter values demonstrated by the prototype devices, we calculate that noise equivalent power levels of $6 \times 10^{-12}$ watts/$\sqrt{Hz}$ are expected, assuming 75% coupling efficiency to the radiative mm-wave field. This calculated figure is in close agreement with experimental data obtained on prototype devices.

EXPERIMENTAL RESULTS

Prototype devices have been connected to an electronic readout circuit designed to display small resistance changes on an oscilloscope. The sensors were installed in a metal chamber that could be evacuated to vary the sensor thermal leak. Windows of ZnS and glass were available to admit IR and mm-wave radiation into the sensor chamber. A 10 Hz chopper was mounted in front of the sensor window. A 1000° K black body IR source was used to calibrate the sensor with an IR intensity of $7 \times 10^{-4}$ W/cm$^2$. A sensor response of about 100 mV was observed with the sensor at atmospheric pressure, and about 400 mV with the sensor cell evacuated. A 3.2 mm (94 GHz) CW oscillator source was used to illuminate the sensor with a mm-wave intensity of about $2 \times 10^{-3}$ w/cm$^2$ at the sensor. The observed signal amplitude from the sensor was measured at 280 mV. The mm-wave signals increased in amplitude by about a factor of four as the cell pressure was reduced from 760 to 0.5 torr, indicating that the signal was due to the normal microsensor thermal response mechanism.

MICROANTENNA CONSIDERATIONS

The properties of planar antennas lying on dielectric (e.g. Si, Si$_3$N$_4$, SiO$_2$) surfaces are quite different from antennas in homogeneous media. The principal differences are (1) the polar diagram is always heavily biased towards the dielectric, so that efficient collection of radiation is biased towards radiation incident from the dielectric side, and (2) additional peaks in the polar diagram may occur: some peaks are found along the substrate surface plane, indicating coupling to substrate surface waves which will lead to cross-talk between adjacent antennas on that surface. Although the polar diagram of a planar antenna on a dielectric substrate is heavily biased towards the dielectric, this bias can be reversed by depositing a metallic ground plane (e.g. 2000° A copper) on the back surface of the silicon substrate as shown in FIG. 5a, so that all radiation is reflected towards the air side, and the antenna only "looks" towards the air. This arrangement is very desirable, since IR sensors receive radiation from the airside, and common reflective optics can then be used for an array of mm-wave and IR-sensors fabricated on the same silicon wafer.

Figure 8:
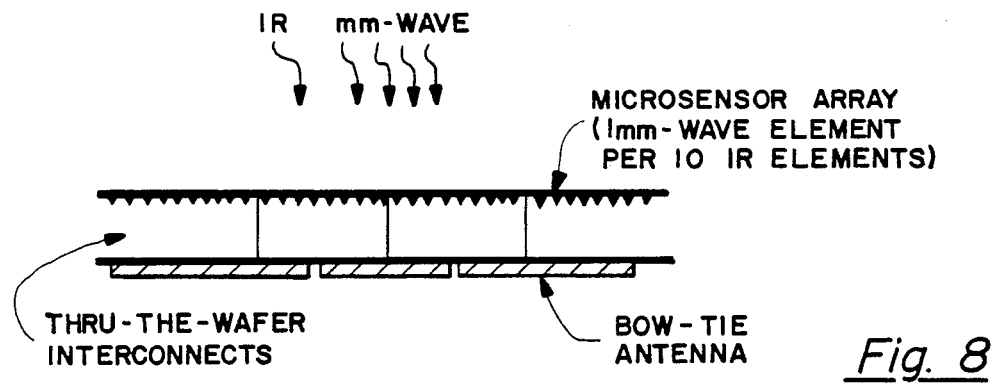
Figure 9:
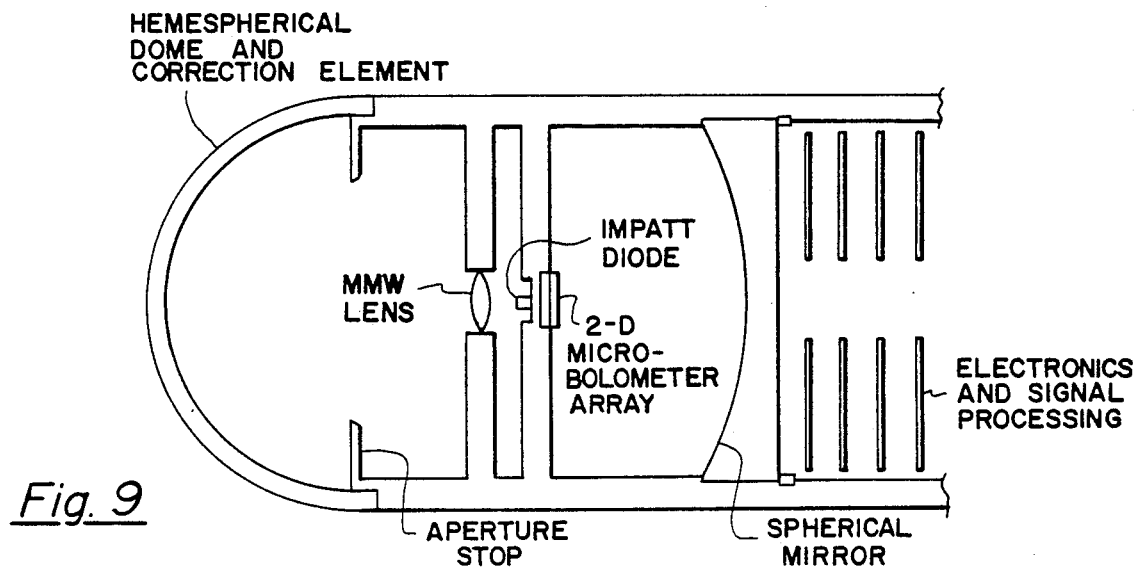
FIG. 9 shows one embodiment of a dual-mode system illustrated schematically in FIG. 6.

An alternate modification alluded to earlier is the use of "bow-tie" antenna designs where the incident radiation is through the dielectric substrate. Our tests have shown that bow-tie antennas can be used in linear arrays to efficiently collect mm-wave radiation incident through the substrate. In this configuration the IR radiation is absorbed in the front side detector elements while the mm-wave radiation passes through the silicon wafer and is collected by the backside bow-tie antennas (FIG. 8). In this approach through-the-wafer interconnects from antenna to sensor are preferably used. This alternate approach offers good performance, with Simple, planar geometry fabricated from metal films deposited on Si wafer surfaces.

A polar diagram heavily biased (by a factor n$^3$), where n is the refractive index, into the dielectric, with beam width tailorable by adjustment of the bow-tie angle as shown in FIG. 8.

A resistive characteristic impedance, tailorable by adjustment of the bow-tie angle, constant over wide frequency range.

COUPLING OF ANTENNA TO MICROSENSORS

The simplest way of coupling a dipole antenna to a radiation sensor is to fabricate the sensor between the arms of the dipole and metallize the antenna to the sensor load. The antenna impedance can be matched to sensor loads in the 100 ohm range.

The embodiments of the invention in which an exclusive property or right is claimed are defined as follows:

1. An integrated dual-mode infrared and millimeter-wave focal plane sensor array monolithically fabricated on the same silicon wafer comprising:
   a wafer of single crystal silicon having opposing flat surfaces;
   a first linear or two-dimensional array of infrared sensitive sensors being fabricated on a first surface of said wafer said infrared sensors each having electrical output means; and,
   a further linear or two dimensional array of mm-wave sensitive sensors fabricated on said first surface interspersed with said first array sensors, said further array sensors being dimensionally too small to effectively couple mm-wave energy, said mm-wave sensors each having connected thereto a microantenna of a size substantially matched to the wavelength of the mm-waves for coupling received mm-wave radiation to the mm-wave sensors, said mm-wave sensors each having electrical output means.

2. The article according to claim 1 in which the first array and the further array are linear arrays.

3. The article according to claim 1 in which the first array and the further array are two dimensional arrays.

4. The article according to claim 1 in which said microantennas are bow-tie antennas.

5. The article according to claim 4 in which said bow-tie antennas are fabricated on a second of said opposing flat surfaces and are connected through the wafer to the mm-wave sensors.

6. The article according to claim 1 in which said microantennas are full-wave dipole antennas.

7. The article according to claim 1 in which said infrared sensors and said mm-wave sensors are bolometers.

8. The article according to claim 1 in which said microantennas are fabricated to said wafer.

* * * * *